United States Patent
Chambers et al.

[11] Patent Number: 6,040,624
[45] Date of Patent: Mar. 21, 2000

[54] SEMICONDUCTOR DEVICE PACKAGE AND METHOD

[75] Inventors: Benjamin C. Chambers, Chandler; William R. Blood, Jr., Fountain Hills; Tien-Yu T. Lee, Phoenix, all of Ariz.

[73] Assignee: Motorola, Inc., Schaumburg, Ill.

[21] Appl. No.: 08/943,020

[22] Filed: Oct. 2, 1997

[51] Int. Cl.[7] ................................................. H01L 23/48
[52] U.S. Cl. ........................ 257/692; 257/668; 257/706
[58] Field of Search ................................... 257/777, 668, 257/701, 692, 723, 724, 706

[56] References Cited

U.S. PATENT DOCUMENTS

| | | | |
|---|---|---|---|
| 3,641,401 | 2/1972 | Lynch | 257/668 |
| 4,246,595 | 1/1981 | Noyori et al. | 257/668 |
| 4,437,141 | 3/1984 | Prokop . | |
| 4,684,974 | 8/1987 | Matsunaga et al. | 257/668 |
| 4,721,995 | 1/1988 | Tanizawa | 257/668 |
| 4,890,157 | 12/1989 | Wilson | 257/668 |
| 4,954,877 | 9/1990 | Nakanishi et al. . | |
| 4,975,765 | 12/1990 | Ackermann et al. . | |
| 5,161,009 | 11/1992 | Tanoi et al. | 257/668 |
| 5,598,033 | 1/1997 | Behlen et al. . | |
| 5,760,465 | 6/1998 | Alcoe et al. . | |
| 5,763,940 | 6/1998 | Shibusawa et al. . | |
| 5,764,497 | 6/1998 | Mizumo . | |

*Primary Examiner*—Sheila V. Clark
*Attorney, Agent, or Firm*—Robert F. Hightower; A. Kate Huffman

[57] ABSTRACT

A chip scale power semiconductor device (16) provides improved heat dissipation. A semiconductor die (19) is mounted in a first region of a substrate (18). The substrate is extended to a second region for disposing terminals (38) to make external connections to the semiconductor device. Conductors (34) formed on the substrate electrically couple the semiconductor die to the terminals. The substrate is extended for a predetermined distance to separate the second region from the first region for isolating the temperature of the semiconductor die from the local temperature at the terminals.

4 Claims, 2 Drawing Sheets

SEMICONDUCTOR DEVICE PACKAGE AND METHOD

BACKGROUND OF THE INVENTION

The present invention relates in general to semiconductor devices and, more particularly, to a semiconductor device whose package combines high power dissipation with a small footprint.

Modern semiconductor technology is producing integrated circuits containing up to several million transistors. Such high integration levels provide increased functionality while creating the problem of dissipating the power generated by the large number of transistors. Portable equipment such as pagers and cellular telephones benefit from the increased functionality but also create a need to reduce the physical size of these integrated circuits to fit within their smaller housings.

The physical size of many integrated circuits often is determined by the area needed for providing hundreds of package terminals whose dimensions are configured for mounting on a system circuit board because the minimum feature size of a system circuit board is larger than that of an integrated circuit. For example, integrated circuits are commercially available whose input/output interconnect pitch is less than 0.1 millimeters, whereas interconnect traces for mounting the integrated circuit on a system circuit board are formed with a pitch of about 0.4 millimeters, more than 4 times larger.

To provide a large number of terminals in a small package area, chip scale packages have been developed which consume nearly the same area on the circuit board as the area of the encapsulated die. For example, a chip scale package for housing a square die 10.0 millimeters on a side typically occupies an area between 10.0 and 16.0 millimeters on a side. The small footprint is achieved by forming die mounting flags on the interposer which are aligned with and soldered to the bonding pads of the die in a "flip-chip" fashion. The die mounting flags are coupled with wiring traces to more loosely spaced package terminals of the interposer. The die can be encapsulated in a molding compound for protection.

A problem with prior art chip scale packages is high thermal resistance due to their small area and the low thermal conductivity of the interposer substrate, which limits the power dissipation of the device. In addition, such high thermal resistance can result in damage to the integrated circuit from elevated temperatures created by power dissipated by nearby components. Heat sinks could be mounted on the package to reduce the die temperature, but heat sinks increase the package footprint and induce mechanical stress on the package which can adversely affect the reliability of the device.

Hence, there is a need for a small footprint semiconductor device with increased power handling capability.

DETAILED DESCRIPTION OF THE DRAWINGS

Figure 1:
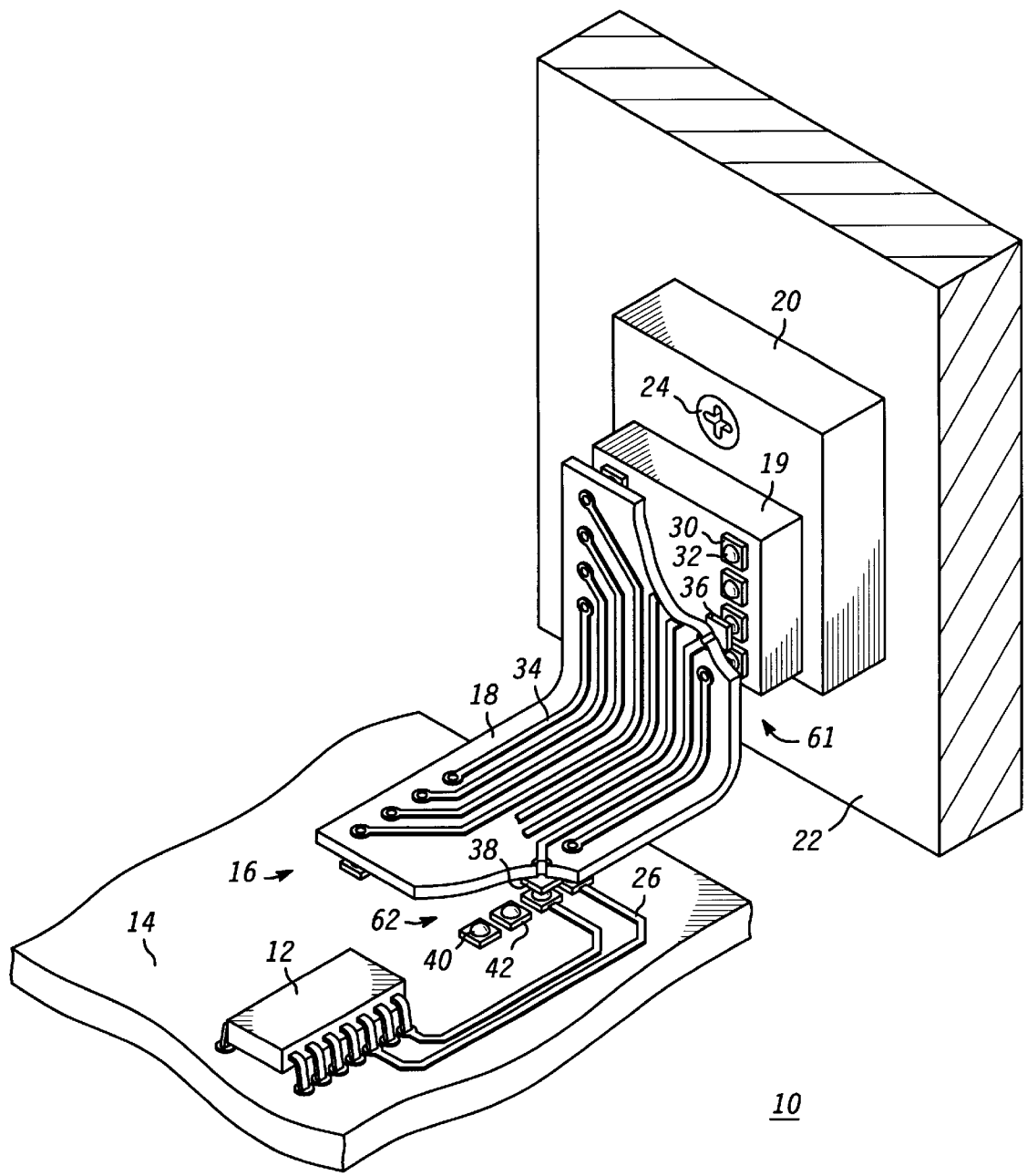
FIG. 1 is a cutaway isometric view of an electrical system.

FIG. 1 is a cutaway isometric view of an electrical system 10 including a system printed circuit board 14 for mounting and interconnecting electrical components 12 and a semiconductor device 16. A heat sink 20 is mounted to a chassis 22 by means of a screw 24 or the equivalent, and a layer of thermally conductive paste is applied between heat sink 20 and chassis 22 to thermally couple heat sink 20 to chassis 22. In an alternative system where a heat sink is not used, semiconductor device 16 can be thermally coupled directly to chassis 22.

System board 14 includes a substrate made from a dielectric material such as ceramic, epoxy fiberglass, or phenolic to provide mechanical support for electrical components 12 mounted on its surface. These substrate materials have a low thermal conductivity and therefore a limited capacity to remove heat generated by electrical components 12. If too much heat is generated, an excessive temperature can arise near the surface of system board 14, damaging circuit components and decreasing system reliability. System board 14 includes one or more layers of wiring traces 26 operating as electrical conductors for interconnecting electrical components 12.

Semiconductor device 16 includes a distribution substrate 18 and a semiconductor die 19 which typically is an integrated circuit die. Substrate 18 is made from a flexible material such as polyimide that has a surface for disposing wiring traces 34 to electrically connect semiconductor die 19 to terminals 38 and to traces 26 of system board 14.

Substrate 18 has a mounting region 61 containing closely spaced die mounting flags 36 which are aligned with bonding pads 30 of semiconductor die 19. Bonding pads 30 are soldered to the die mounting flags to mount semiconductor die 19 to substrate 18 using a standard "flip-chip" process. The die mounting flags are coupled to wiring traces 34. An underfill material (not shown) typically made of epoxy is interposed between substrate 18 and semiconductor die 19 to provide a rigid mounting base for protecting semiconductor die 19 from vibration and other mechanical stresses that can cause lifting or other damage.

Substrate 18 includes a terminal region 62 for disposing terminals 38 of semiconductor device 16 to make external connections to electrical components 12. Terminals 38 are electrically coupled to semiconductor die 19 along traces 34 formed on substrate 18. Substrate 18 is extended for a distance to thermally isolate die mounting region from terminal region 62. In other words, die mounting region 61 is separated from terminal region 62 by a distance that avoids heat generated by semiconductor die 19 from adversely affecting the operation of components mounted near terminal region 62, and vice versa. The distance needed to achieve thermal isolation is highly variable, depending on the amount of heat generated, the size and thermal characteristics of heat sink 20 and/or chassis 22, the desired operating temperature, etc. In a typical embodiment such as the one shown in FIG. 1, where semiconductor die 19 generates 100.0 watts of power, a distance of 2.0 millimeters is typically sufficient to thermally isolate die mounting region 61 from terminal region 62, especially where terminals 38 of semiconductor device 16 are mounted near an edge of system board 14 while semiconductor die 19 is mounted to chassis 22 nearby.

As a feature of the present invention, even 5.0 millimeters of distance between terminal region 62 and die mounting region 61 allows terminals 38 to be attached to system board 14 while mounting semiconductor die 19 to a remotely located heat sink 20. Hence, thermal isolation is achieved without requiring extra space on system board 14 for mounting heat sink 20. Obviously, where heat sink 20 is mounted to chassis 22 at a location more remote from system board 14, substrate 18 can be extended to the distance needed. The extension of substrate 18 typically does not create a signal delay problem, even at higher frequencies. Where necessary, substrate 18 can be configured as a transmission line to minimize signal degradation on traces 34. Solder or thermally conductive silver-epoxy paste or its equivalent is applied between semiconductor die 19 and heat sink 20 to aid in the dissipation of heat generated by semiconductor device 16.

The advantages of the present invention are most appreciated when heat sink 20 is mounted to an area of chassis 22 that would not otherwise be utilized, as shown in the embodiment of FIG. 1. In many systems, such unutilized regions of the chassis are common. By taking advantage of such a region, the present invention allows the temperature of semiconductor die 19 to be controlled while occupying substantially the same area of system board 14 as prior art semiconductor devices that do not have such thermal control.

It can be seen that while substrate 18 can be extended to an arbitrary length, its width retains chip scale dimensions, i.e., a width comparable to that of a prior art chip scale package. In other words, the width of substrate 18 is nearly the same as the width of semiconductor die 19. Hence, semiconductor device 16 occupies the same area of system board 14 as does a chip scale semiconductor package "in one embodiment, the substrate 18 is less than 6 mm greater than a width of a semiconductor device 16." The present invention therefore combines the small footprint of a chip scale package with the substantial power handling capability of a physically larger power semiconductor package to increase the integration level of semiconductor die 19 while controlling the temperature. In one embodiment of semiconductor device 16, a factor of fifty reduction in thermal resistance has been observed when compared with a device housed in a prior art chip scale package of comparable size.

As previously described, substrate 18 comprises a flexible material which can bend for mounting terminals 38 to system board 14 while mounting semiconductor die 19 to heat sink 20 or chassis 22 oriented at a different angle. Such materials can bend to a radius less than 5.0 millimeters and are therefore ideally adapted for small volumes. In an alternate embodiment, where such bending or flexibility is not needed, substrate 18 can be made from a rigid material such as the ceramic, epoxy fiberglass, or phenolic material similar to that used to fabricate system board 14.

Many prior art chip scale packages mount the semiconductor die on a mechanically rigid substrate to prevent both the die and the solder bumps from incurring cracking or other damage when subjected to mechanical stresses such as vibration. Other prior art chip scale packages use an epoxy underfill layer interposed between the die and substrate (either rigid or flexible) to provide the needed rigidity. The present invention takes advantage of the rigid nature of heat sink 20 or chassis 22 to provide a similar mechanical protection of semiconductor die 19.

Figure 2:
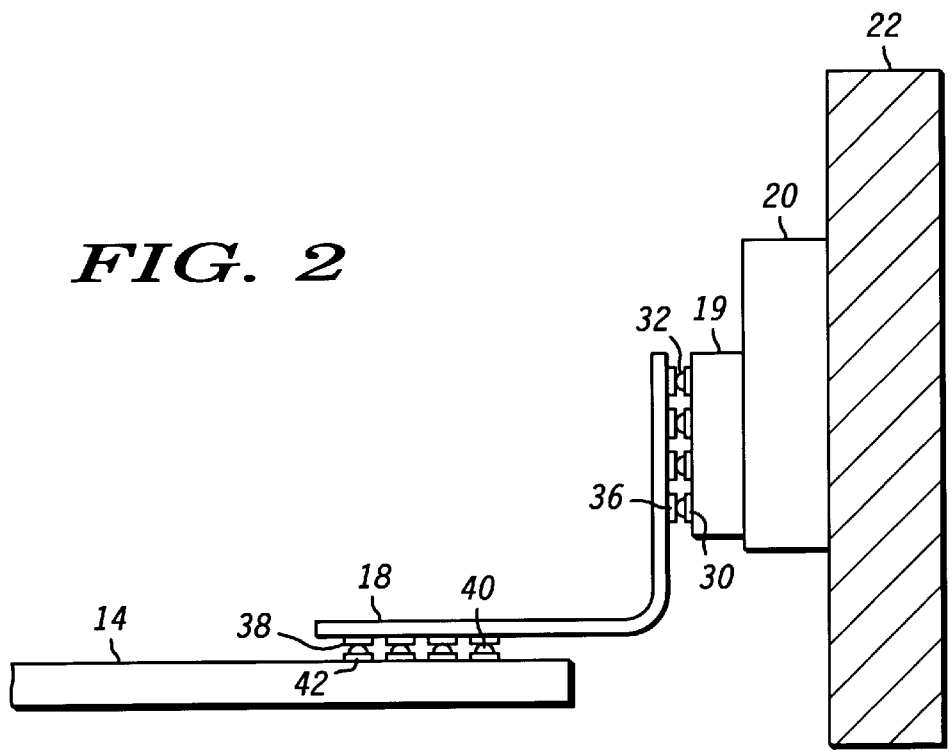
FIG. 2 is a side view showing further detail of the mechanical and electrical connection of semiconductor device.

FIG. 2 is a side view showing further detail of the mechanical and electrical connection of semiconductor device 16 to heat sink 20 and to system board 14. In the figures, elements having the same reference number have similar functions. Solder bumps 32 are formed on bonding pads 30 during the manufacture of semiconductor die 19. A plurality of mounting flags 36 coupled to traces 34 (not shown in FIG. 2) are arranged on a surface of substrate 18 in a mirror image pattern to bonding pads 30 such that when solder bumps 32 are reflowed, semiconductor die 19 is electrically coupled to mounting flags 36 and traces 34, using feedthrough vias (not shown) if necessary.

At the other end of traces 34, flags are formed for operating as terminals 38 of semiconductor device 16. Solder balls 40 are reflowed to attach and electrically couple terminals 38 to flags 42 for interconnecting with electrical components 12.

Figure 3:
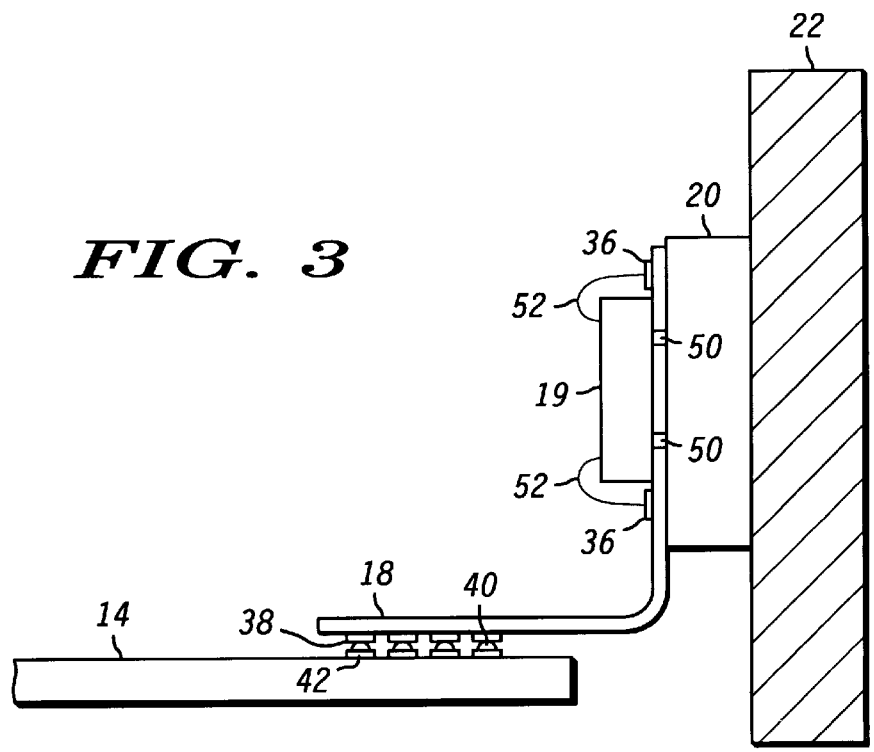
FIG. 3 is a side view of a detail of a semiconductor device in an alternate embodiment.

FIG. 3 is a side view showing a detail of an alternate arrangement of semiconductor device 16 with respect to heat sink 20 and system board 14. Substrate 18 is thermally connected to heat sink 20 using a solder paste or similar thermally conductive material. Semiconductor die 19 is mounted on a first region of substrate 18 with its inactive surface facing substrate 18. Semiconductor die 19 is held in place with silver epoxy or a similar thermally conductive adhesive material. Heat is routed away from semiconductor die 19 to heat sink 20 through feedthrough holes 50 drilled or punched in substrate 18 and filled with a high thermal conductivity material such as copper or solder. Semiconductor die 19 is electrically coupled to terminals 38 by attaching wire bonds 52 between bonding pads formed on the active surface of semiconductor die and wire bond flags 36, which are electrically coupled to terminals 38 and system board 14 as described above. Semiconductor die 19 is encapsulated in a standard die coating material or molded plastic compound (not shown) applied to its active surface to further protect semiconductor die 19 and wire bonds 52.

By now it should be appreciated that the present invention provides a chip scale semiconductor device with improved heat dissipation. A semiconductor die is mounted in a die mounting region of a substrate and coupled to wiring traces disposed on the substrate. The substrate has a terminal region for disposing terminals for making external connections to the semiconductor device. The terminal region is separated from the die mounting region by a distance that allows a physical characteristic of the semiconductor die to be controlled without altering a physical characteristic of the terminal region or the system circuit board. Device temperature is an example of such a physical characteristic, and is controlled by thermally coupling the semiconductor die to a heat sink or a chassis in which an electrical system is housed. Conductors are formed on the substrate to electrically couple the semiconductor die to the terminals. By mounting the terminal region of the substrate to the system circuit board, a minimum amount of circuit board area is occupied by the semiconductor device. The substrate is extended to a control device such as a heat sink, which can be located remotely so as to not require mounting to the system circuit board. Hence, temperature is controlled without increasing the circuit board area occupied by the semiconductor device.

We claim:

1. A semiconductor package, comprising:
    a flexible substrate having a plurality of conductors routed along the flexible substrate between a mounting region of the flexible substrate and a terminal region of the flexible substrate wherein the mounting region is physically separated a distance of at least 2.0 millimeters from the terminal region to thermally isolate the mounting region and the terminal region; and
    a heat generating semiconductor device having a first surface disposed on the mounting region of the flexible substrate, where the heat generating semiconductor device is mountable to a heat dissipating surface for dissipating the heat generated by the semiconductor device.

2. The semiconductor package of claim 1, wherein the flexible substrate flexes to a radius less than 5.0 millimeters.

3. The semiconductor package of claim 2, wherein the flexible substrate is made from a polyimide material.

4. A semiconductor package, comprising:

a flexible substrate having a plurality of conductors routed along the flexible substrate between a mounting region of the flexible substrate and a terminal region of the flexible substrate wherein the mounting region is physically separated a distance from the terminal region to thermally isolate the mounting region and the terminal region and wherein a width of the flexible substrate is less than six millimeters greater than a width of the semiconductor device; and a heat generating semiconductor device having a first surface disposed on the mounting region of the flexible substrate, where the heat generating semiconductor device is mountable to a heat dissipating surface for dissipating the heat generated by the semiconductor device.

* * * * *